(12) United States Patent
Azpiroz et al.

(10) Patent No.: US 8,351,037 B2
(45) Date of Patent: Jan. 8, 2013

(54) METHOD TO MATCH EXPOSURE TOOLS USING A PROGRAMMABLE ILLUMINATOR

(75) Inventors: Jaione Tirapu Azpiroz, Poughkeepsie, NY (US); Saeed Bagheri, Croton on Hudson, NY (US); Kafai Lai, Poughkeepsie, NY (US); David O. Melville, New York, NY (US); Alan E. Rosenbluth, Yorktown Heights, NY (US); Kehan Tian, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 12/834,379

(22) Filed: Jul. 12, 2010

(65) Prior Publication Data
US 2012/0008134 A1    Jan. 12, 2012

(51) Int. Cl.
*G01B 11/00* (2006.01)
(52) U.S. Cl. .......................................... 356/401; 356/73
(58) Field of Classification Search .................. 356/73, 356/399–401
See application file for complete search history.

(56) References Cited

U.S. PATENT DOCUMENTS

| 6,563,566 | B2 * | 5/2003 | Rosenbluth et al. | 355/67 |
| 7,057,709 | B2 | 6/2006 | Rosenbluth | |
| 2004/0156029 | A1 * | 8/2004 | Hansen | 355/67 |
| 2009/0021718 | A1 | 1/2009 | Melville et al. | |

OTHER PUBLICATIONS

Rosenbluth, A.E. et al., "Global Optimization of the Illumination Distribution to Maximize Integrated Process Window" SPIE v. 6154 Optical Microlithography XIX (2006).
U.S. Appl. No. 12/605,732 entitled, "Constrained Optimization of Lithographic Source Intensities Under Contingent Requirements", filed Oct. 26, 2009, First named inventor: Saeed Bagheri.
Rosenbluth, A.E. et al., "Fast Calculation of Images for High Numerical Aperture Lithography" SPIE v. 5377 Optical Microlithography XVII (2004) pp. 615.

* cited by examiner

*Primary Examiner* — Tara S Pajoohi Gomez
(74) *Attorney, Agent, or Firm* — Scully, Scott, Murphy & Presser, P.C.; Catherine Ivers, Esq.

(57) ABSTRACT

Programmable illuminators in exposure tools are employed to increase the degree of freedom in tool matching. A tool matching methodology is provided that utilizes the fine adjustment of the individual source pixel intensity based on a linear programming (LP) problem subjected to user-specific constraints to minimize the difference of the lithographic wafer data between two tools. The lithographic data can be critical dimension differences from multiple targets and multiple process conditions. This LP problem can be modified to include a binary variable for matching sources using multi-scan exposure. The method can be applied to scenarios that the reference tool is a physical tool or a virtual ideal tool. In addition, this method can match different lithography systems, each including a tool and a mask.

24 Claims, 2 Drawing Sheets

METHOD TO MATCH EXPOSURE TOOLS USING A PROGRAMMABLE ILLUMINATOR

BACKGROUND

The present invention relates to lithographic methods, and particularly to a method for matching a plurality of exposure tools using a programmable illuminator.

Lithographic exposure tools can typically provide disk, dipole, and quadrupole sources, as well as annuli, and along the above lines one can sample the available parametric options for all of these shape choices in such a way as to add to one's source pixel collection a close approximation to all disk, dipole, and quadrupole sources that the tool can provide. To design a multiscan lithographic source formed by these standard sources, one needs to determine the appropriate intensity value that should be assigned to the illuminating beams corresponding to every pixel in the collection.

According to prior art source optimization, linear programming ("LP") algorithm can be employed to calculate the optimal intensity values for such a collection of source pixels. In this case, the optimal solution typically contains a fairly large number of non-zero members. However, it is generally desirable that a multiscan source be composed of only a small number of component scans, for example, three or less, in order to prevent the multiple-scan exposure process from becoming inordinately slow. If the photoresist must remain sensitized (pre-bake-and-develop) during more than three scans, the properties of the photoresist may begin to deteriorate. In addition, the throughput of the exposure tool may be severely constricted.

The prior art source optimization optimizes the pixel configuration of the source by maximizing an objective function $\psi$ that is a metric of the quality of an exposure tool's lithographic printing, such as process window. This method is a global optimization in which the starting point of the solution is not predefined. Using notations in A. E. Rosenbluth and N. Seong, "Global Optimization of the Illumination Distribution to Maximize Integrated Process Window," SPIE v.6154 Optical Microlithography XIX (2006) and U.S. Pat. No. 7,057,709 to A. E. Rosenbluth, "Printing a Mask with Maximum Possible Process Window Through Adjustment of the Source Distribution," which are incorporated herein by reference, an embodiment using LP has the following form:

$$\underset{w.r.t.\ \vec{a}}{\text{Maximize}}[\psi(z_o, K_{Min}, K_{Max}; \vec{a})],$$

(note "w.r.t." means "with respect to.")

where objective $\psi$ is defined by:

$$\psi(z_0, K_{Min}, K_{Max}; \vec{a}) \equiv \sum_{k=K_{Min}}^{K_{Max}} (w'_k - w_k),$$

subject to:

(eq. 1)

$$0 \leq \vec{a}_j S_{Min} \leq S_{Max,j} \vec{a} \cdot \vec{p} \quad (\forall j | 1 \leq j \leq J_{Max}) \quad \text{a)}$$

$$\vec{a} \cdot \vec{I}'_{i[r,n]}(0, z_0) = 1 \quad (\forall n, r | 1 \leq r \leq r_{Max,OPC}[n], 1 \leq n \leq n_{Max}) \quad \text{b)}$$

$$\vec{a} \cdot \vec{I}'_{i[u,n]}(0, z_0) \geq R^{(n)}_{Bright} \quad (\forall n, u | 1 \leq u \leq u_{Max}[n], 1 \leq n \leq n_{Max}) \quad \text{c)}$$

$$\vec{a} \cdot \vec{I}'_{i[v,n]}(0, z_0) \leq R^{(n)}_{Dark} \quad (\forall n, v | 1 \leq v \leq v_{Max}[n], 1 \leq n \leq n_{Max}) \quad \text{d)}$$

$$w_k \geq \vec{a} \cdot \vec{I}'_{i[r,n]}(CD_+, z_0 + k\Delta z) \quad \text{e)}$$
$$(\forall r, n, k | 1 \leq r \leq r_{Max}[n], K_{Min} \leq k \leq K_{Max}, 1 \leq n \leq n_{Max})$$

$$w'_0 \geq \vec{a} \cdot \vec{I}'_{i[r,n]}(CD_+, z_0 + k\Delta z) \quad \text{f)}$$
$$(\forall r, n, k | 1 \leq r \leq r_{Max}[n], K_{Min} \leq k \leq K_{Max}, 1 \leq n \leq n_{Max})$$

$$w'_k \leq \vec{a} \cdot \vec{I}'_{i[r,n]}(CD_-, z_0 + k\Delta z) \quad \text{g)}$$
$$(\forall r, n, k | 1 \leq r \leq r_{Max}[n], K_{Min} \leq k \leq K_{Max}, 1 \leq n \leq n_{Max})$$

$$w_0 \leq \vec{a} \cdot \vec{I}'_{i[r,n]}(CD_-, z_0 + k\Delta z) \quad \text{h)}$$
$$(\forall r, n, k | 1 \leq r \leq r_{Max}[n], K_{Min} \leq k \leq K_{Max}, 1 \leq n \leq n_{Max})$$

$$w_k \geq w_{k-1} \quad (\forall k | 1 \leq k \leq K_{Max}) \quad \text{i)}$$

$$w_k \leq w_{k-1} \quad (\forall k | K_{Min} + 1 \leq k \leq -1) \quad \text{i')}$$

$$w'_k \leq w'_{k-1} \quad (\forall k | 1 \leq k \leq K_{Max}) \quad \text{j)}$$

$$w'_k \geq w'_{k-1} \quad (\forall k | K_{Min} + 1 \leq k \leq -1) \quad \text{j')}$$

$$w_k \leq w'_k \quad (\forall k | K_{Min} \leq k \leq K_{Max}) \quad \text{k)}$$

The script s, w, and w' variables are always allowed to vary in the above prior art LP formulation. This LP formulation can optionally be embedded in an outer loop or optimization in which z0, $K_{min}$, and $K_{max}$ are allowed to vary, but these latter parameters are treated as constant when the above LP is solved.

The constraints in eq. 1 are only representative. Many different kinds of constraints can be used to define the set of possible (i.e., allowed) intensities at image sample points and in the source beams. The symbols used in the eq. 1 can readily be employed to define many variants, as will be clear to those skilled in the art.

Variables z0, $K_{Max}$, and $K_{Min}$ are the centerpoint, upper (positive) limit, and lower negative) limit, respectively, of the depth of focus. For simplicity, these variables are expressed as integer multiples of a fixed stepsize $\Delta z$. These focal variables are ordinarily given fixed values in eq. 1, in order that the equation can be solved as a pure LP using standard methods. This LP can then be embedded in an outer search loop that finds optimal values for the focal variables. An alternative approach may optionally be used in the present invention, as will be discussed below.

The optimal intensity that should be given to each source pixel in the collection of possible choices is represented as a list of unknowns. Following standard practices, a vector notation can be used for this list in which the optimal intensities of the different pixels are tabulated like the components of a vector. In Eq. 1, units for these source intensities are selected such that the maximum possible value that the illuminator can provide in any pixel is normalized to 1. The list of unknown pixel intensities is written as $\vec{s}$, but eq. 1 uses a re-scaled list $\vec{a}$ that is related to the desired solutions $\vec{s}$ according to the following formula:

$$s_j = \boldsymbol{a}_j \underset{k}{\text{Min}} \left[ \frac{S_{MAX,k}}{\boldsymbol{a}_k} \right]. \quad \text{(eq. 2)}$$

In lithographic applications, it is usually preferable to define process window in terms of percentage or fractional variations, rather than absolute variations. The integrated fractional exposure latitude can be optimized by using the scaled $\vec{s}$ variables rather than the integrated absolute dose or intensity latitudes.

It is convenient to use units for the sj such that the physical limits on their attainable values are scaled to a 0-to-1 range. However in particular problems the source intensities can have other more specialized limits imposed upon them. Towards that end, the parameters $S_{Max,j}$ in eqs. 1 and 2 represent problem-specific limits that can be imposed on the intensity of each j-th source pixel. Each $S_{Max,j}$ should always be 1 or less. Each $S_{Max,j}$ is 1 if the full range of deliverable pixel intensity is to be considered. However, the $S_{Max,j}$ parameters allow stronger restrictions to optionally be placed on some or all of the pixels. For example, a resemblance of the solution to some reference source of interest can be enforced by limiting the intensities of those solution pixels that are switched-off in the reference source.

In addition, it is often inconvenient to maintain the 0-to-1 pixel intensity scale when the solution is ported to other modules for subsequent lithographic analysis and optimization. For example, the source pixels will typically have different areas, and larger pixels will usually be able to deliver proportionately more light. Eq. 1 uses the symbol $\vec{p}$ to denote the list of maximum possible intensities in un-normalized form that the various pixels can deliver. Often $p_j$ would simply be the area of the j-th pixel, e.g., in units where the full pupil area is 1. Each source pixel is typically given the shape of a symmetric quadrupole in order to avoid skew through focus. By symmetry the shape of the pixel-pole in one quadrant of the illumination pupil suffices to determine the pixel shape in the other three quadrants. By convention, pixel properties are often described in terms of single-quadrant parameters only.

The desired properties of the image intensity distribution are specified using discrete sample points, i.e., evaluation points or positions in the image where the metric to be optimized is measured or evaluated in the simulated image. The density of the simulated image sufficiently exceeds the lens resolution that the sampled intensity adequately represents the character of the image. For example, certain classes of sample points can be used to map out the nominally bright and dark regions of the image. Other classes define the boundaries of the acceptable band of positions in which each feature edge can be allowed to print (tolerance bands). During source optimization, the mask or masks that form the image are usually fixed. In the image plane, the intensity at a given point can be written as a sum of contributions from each unknown source element, i.e., as $\vec{s} \cdot \vec{I}$, where $\vec{I}$ is a list of the intensities that each pixel would provide at the given image point if fully switched on. (The prime mark that appears on $\vec{I}'$ in eq. 1 is issued below.) The intensity contributions from different elements add incoherently. For a given mask, each element of $\vec{I}'$ thus expresses as a numerical value the imaging relationship that exists between the intensity of the corresponding source pixel and the intensity at a particular point in the image. These numerical values can be calculated using well known image simulation methods.

Different target shapes might be desired for the printed feature in different resist regions D. For example, in advanced damascene technologies, the 3D target shape might have different 2D cross-sections that reflect the desire to print different 2D target shapes at different depths in the resist. Since the image shape is defined by sample points, such 3D shape requirements entail the use of separate categories of sample points that are specific to different regions D. To distinguish bright and dark sample points in different regions, a notational convention can be used where the generic subscript index i is written as i(u, D) (for bright) or i(v, D) (dark), in a given region D, in which u and v are therefore indices which represent different bright and dark sample points. In a given region D, these indices suffice to identify an overall sample point index i. Use of distinct letters u and v is adopted to clearly distinguish the bright or dark status of sample points in the interior of features. The number of sample points in different D regions may vary, leading to changing integer limits on u and v.

Though this option is mentioned here, explicit identification of depth regions are avoided for simplicity in the discussion that follows. It will be clear to those skilled in the art how they may be included.

Fractional (percentage) objectives, like integrated fractional exposure latitude, typically require the specification of a particular "anchor feature" to serve as the normalizing reference. Generally, the printed edge of some critical dimension ("CD") is chosen as the anchor feature in the prior art problem. By convention, a D=1 region (e.g. depth position 1) is designated as the region which contains the anchor feature. For brevity, eq. 1 then makes use of an "effective intensity" that takes into account the varying sensitivity of the resist according to the formula:

$$\vec{I}' = t^{(1)} \vec{I} / t^{(n)} \quad \text{(Eq. 3)}$$

By using this method, the intensity can be generalized to incorporate a photoresist mean time for moduatlion transfer function ("MTF") that accounts for effects like resist diffusion. This generalized or effective intensity will be referred to simply as the intensity for brevity. When applied in the image plane, the term "intensity" can be assumed to refer to the generalized or effective intensity unless otherwise stated.

BRIEF SUMMARY

Programmable illuminators in exposure tools are employed to increase the degree of freedom in tool matching. A tool matching methodology is provided that utilizes the fine adjustment of the individual source pixel intensity based on a linear programming (LP) problem subjected to user-specific constraints to minimize the difference of the lithographic wafer data between two tools. The lithographic data can be critical dimension differences from multiple targets and multiple process conditions. This LP problem can be modified to include a binary variable for matching sources using multi-scan exposure. The method can be applied to scenarios that the reference tool is a physical tool or a virtual ideal tool. In addition, this method can match different lithography systems, each including a tool and a mask.

According to an aspect of the present invention, a method of matching at least one lithographic tool using a programmable illuminator is provided. The method includes: providing reference lithographic data from a reference physical illumination tool or an ideal illumination tool; generating measured lithographic data from a lithographic tool having a programmable illuminator; calculating a difference between the reference lithographic data and the measured lithographic data; minimizing a metric of difference d with respect to $\vec{s}$ by solving a linear programming problem (LP) under the constraints of:

$$0 \leq s_j \leq S_{Max,j} \; (\forall j | 1 \leq j \leq J_{Max}) \quad a_1)$$

$$\vec{s} \cdot \vec{p} \geq S_{Min} \quad a_2)$$

$$s_j \leq s_{0,j} + \delta \; (\forall j | 1 \leq j \leq J_{Max}) \quad a_3)$$

$$s_j \geq s_{0,j} - \delta \; (\forall j | 1 \leq j \leq J_{Max}) \quad a_4)$$

$$d \geq \vec{s} \cdot \vec{I}_r - \vec{s}_0 \cdot \vec{I}_{r,0} - (X - X_0)\left(\vec{s}_0 \cdot \dot{\vec{I}}_r\right) \; (\forall r | 1 \leq r \leq r_{Max}) \quad b_1)$$

$$d \geq \vec{s}_0 \cdot \vec{I}_{r,0} - \vec{s} \cdot \vec{I}_r - (X_0 - X)\left(\vec{s}_0 \cdot \dot{\vec{I}}_r\right) \; (\forall r | 1 \leq r \leq r_{Max}), \quad b_2)$$

wherein $\vec{s}$ is a list of unknown source pixel intensities, $s_j$ is a j-th component of $\vec{s}$, j is an index running from 1 to $J_{Max}$, $J_{Max}$ is a total number of source pixels, $S_{Max,j}$ is a j-th component of a maximum source pixel intensity, $\vec{p}$ is a list of source pixel areas, $S_{Min}$ is a minimum allowed pupil fill, $s_{0,j}$ is a j-th component of a reference source intensity list, $\delta$ is a tolerance on allowed deviation of the measured lithographic data from the reference lithographic data, $\vec{s}_0 \cdot \vec{I}_{r,0}$ denotes an intensity provided by a reference source that generates the reference lithographic data at an r-th sample point, $\vec{s} \cdot \vec{I}_r$ denotes a corresponding intensity provided by a source of the lithographic tool at the r-th sample point, r is an index running from 1 to $r_{Max}$, $r_{Max}$ is a total number of sample points, $\vec{s}_0 \cdot \dot{\vec{I}}_r$ is an image slope dI/dx in the direction perpendicular to the edge contour under conditions where the tool prints a reference pattern, X is a measured edge position at an r-th sample point when a reference source is used in the lithographic tool, and $X_0$ is a corresponding position in a corresponding measurement taken on exposures with the reference physical illumination tool or an equivalent calculated from the ideal illumination tool.

According to another aspect of the present invention, another method of matching at least one lithographic tool using a programmable illuminator is provided. The method includes: providing reference lithographic data from a reference physical illumination tool or an ideal illumination tool; generating measured lithographic data from a lithographic tool having a programmable illuminator; calculating a difference between the reference lithographic data and the measured lithographic data; minimizing a metric of difference d with respect to $\vec{s}$ by solving a linear programming (LP) problem under the constraints of:

$$0 \leq s_j \leq S_{Max,j} \; (\forall j | 1 \leq j \leq J_{Max}) \quad a_1)$$

$$\vec{s} \cdot \vec{p} \geq S_{Min} \quad a_2)$$

$$s_j \leq s_{0,j} + \delta \; (\forall j | 1 \leq j \leq J_{Max}) \quad a_3)$$

$$s_j \geq s_{0,j} - \delta \; (\forall j | 1 \leq j \leq J_{Max}) \quad a_4)$$

$$d \geq \vec{s} \cdot \vec{I}_r - \vec{s}_0 \cdot \vec{I}_{r,0} - (X - X_0)\left(\vec{s}_0 \cdot \dot{\vec{I}}_r\right) \; (\forall r | 1 \leq r \leq r_{Max}) \quad b_1)$$

$$d \geq \vec{s}_0 \cdot \vec{I}_{r,0} - \vec{s} \cdot \vec{I}_r - (X_0 + X)\left(\vec{s}_0 \cdot \dot{\vec{I}}_r\right) \; (\forall r | 1 \leq r \leq r_{Max}) \quad b_2)$$

$$s_j \leq S_{Max,j} b_j \; (\forall j | 1 \leq j \leq J_{Max}) \quad m_1)$$

$$\sum_{j=1}^{J_{Max}} b_j \leq m \quad m_2)$$

wherein $\vec{s}$ is a list of unknown source pixel intensities, $s_j$ is a j-th component of $\vec{s}$, j is an index running from 1 to $J_{Max}$, $J_{Max}$ is a total number of source pixels, $S_{Max,j}$ is a j-th component of a maximum source pixel intensity, $\vec{p}$ is a list of source pixel areas, $S_{Min}$ is a minimum allowed pupil fill, $s_{0,j}$ is a j-th component of, a reference source intensity list, $\delta$ is a tolerance on allowed deviation of the measured lithographic data from the reference lithographic data, $\vec{s}_0 \cdot \vec{I}_{r,0}$ denotes an intensity provided by a reference source that generates the reference lithographic data at an r-th sample point, $\vec{s} \cdot \vec{I}_r$ denotes a corresponding intensity provided by a source of the lithographic tool at the r-th sample point, r is an index running from 1 to $r_{Max}$, $r_{Max}$ is a total number of sample points, $\vec{s}_0 \cdot \dot{\vec{I}}_r$ is an image slope dI/dx in the direction perpendicular to the edge contour under conditions where the tool prints a reference pattern, X is a measured edge position at an r-th sample point when a reference source is used in the lithographic tool, $X_0$ is a corresponding position in a corresponding measurement taken on exposures with the reference physical illumination tool or an equivalent calculated from the ideal illumination tool, $b_j$ is a j-th component of a binary variable, and m is a maximum number of exposure scans.

DETAILED DESCRIPTION

Figure 1:
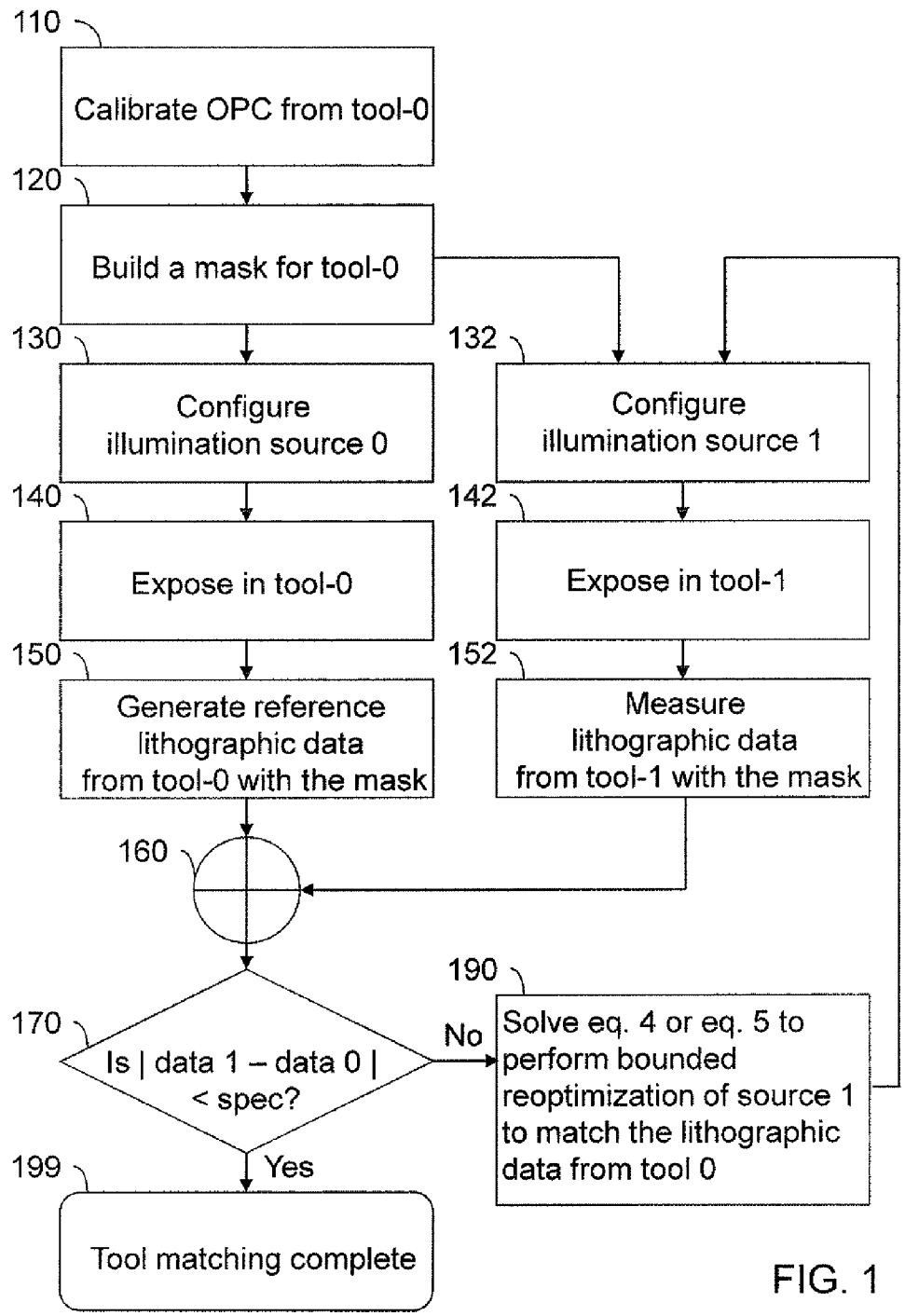
FIG. 1 is a first flow chart outlining a process for matching the lithographic characteristics of a tool (tool-1) with the corresponding lithographic characteristics of a reference tool (tool-0) according to a first embodiment of the present invention.

As stated above, the present invention relates to a method for matching a plurality of exposure tools using a programmable illuminator, which is now described in detail with accompanying figures. It is noted that like and corresponding elements are referred to by like reference numerals.

As used herein, "lithographic fabrication" refers to formation of a lithographic image by at least one exposure step and at least one development step.

As used herein, "lithographic data" or "printed wafer image data" refers to dimensional data measured on features lithographically printed on a wafer.

As used herein, a "source" or an "illumination source" refers to a device configured to emit radiation for the purpose of lithographic exposure.

As used herein, a "mask," a "physical mask," or a "lithography mask" refers to a template used in photolithography that allows selective exposure of a photosensitive surface through a patterned layer included therein and having a different opacity than a background layer.

As used herein, a "physical illumination tool" refers to a physically-existing lithographic tool that is capable of lithographic illumination to expose a photoresist layer on a substrate.

As used herein, an "ideal illumination tool" refers to a virtual lithographic tool that is not present in a physical form, but having simulated characteristics of a physically-existing lithographic tool to provide a result of a simulated exposure on a simulated photoresist layer.

As used herein, a "programmable illuminator" refers to an illumination optics hardware that allows users to program its illumination output profile pixel by pixel.

As used herein, a "diffractive optical element source" refers to a piece of transparent substrate that is etched in a way that it will diffract incident light into a predesigned diffraction pattern.

As used herein, a "script-s variable" refers to a source variable which is a list of intensity of each source pixels.

As used herein, an "LP" refers to linear programming.

As used herein, a "source mask optimization" refers to a process of a mathematical optimization which simultaneously solves for the optimum source profile and mask pattern of a particular target design given a particular exposure tool configuration.

As used herein, a "sample point" or an "evaluation point" refers to points at which measurements are taken from the "r" image using a "golden" source, i.e., a reference source, and a "new" image from the source to be optimized.

As used herein, an "edge position" refers to the location of the edge of a line segment measured from the center of a particular symmetric target.

As used herein, "optical proximity correction" refers to a photolithography enhancement technique used to compensate for image errors due to diffraction or process effects.

In embodiments of the invention that involve parametric source variables, such as the adjustable radii of annular source shapes, it is preferable to convert each such parameter into a set of separate intensity variables. Specifically, this set of intensity variables is generated by forming a table of pixels each representing a sampled combination of options for the parametric variables. For example, one might generate a table of overlapping annular pixels corresponding to a densely sampled collection of possible combinations for the two radii. Each source pixel is simply an annulus in the illumination pupil that has a particular pair of possible values for its inner and outer radii. The collection of annuli is made sufficiently exhaustive that one can approximately match any allowed pair of inner and outer radii with a member of the collection.

Even though these annular pixels would most naturally be thought of as different source options, these annular pixels are regarded as separate pixel elements in an overall source in the present invention. In general, any single annular source can be specified in this framework by assigning zero intensity to all other members of the collection. In this way, any parametric settings of the annulus can be approximately duplicated using only the intensity variables representing the pixel intensities. The intensity variables are non-parametric variables.

In a pixel collection that samples all possible setpoints for a parametrically adjustable annular source, inner and outer radii are adjustable. Other parametric source shape options such as quadrupoles may be available for the pixel collection. An arbitrary annular source can be approximately represented by switching on the most closely matching pixel in the pixel collection. A multi-scan source can be represented by switching on more than one pixel.

Such a collection of annular pixels includes a close approximation to all possible annular sources that a lithographic exposure tool can provide. In physical terms, any such annulus represents a complexly-structured beam of light with which the exposure tool can illuminate the mask. Moreover, a multiscan source including, for example, a pair of annuli can be obtained by first illuminating the mask with the light beam corresponding to one of the annuli, and then with the beam corresponding to the second annulus. The intensity of each beam is adjustable. Practically, the mask can be considered to be illuminated by the beams corresponding to every possible annulus in the collection, with all but two of those beams being given zero intensity. Multiscan sources represent a simple form of programmed illumination that is supported on most exposure tools today. Pixel collections that sample the available settings for parameterized source shapes are herein referred to as source collections, or pixel collections, or source sets.

According to an embodiment of the instant invention, a method of matching at least one lithographic tool using a programmable illuminator is provided. The method includes the following sequential steps. The first step is a step of providing reference lithographic data from a reference physical illumination tool (tool-0) or an ideal illumination tool. The reference lithography data is measured from wafers that are exposed by a physical mask built with calibrated Optical Proximity Correction (OPC) applied. The second step is a step of generating measured lithographic data from a lithographic tool (tool-1) having a programmable illuminator. Note that this lithography data comes from the lithography tool by a single exposure. The third step is the step of calculating a difference between the reference lithographic data and the measured lithographic data by solving a Linear Programming (LP) under a specific set of constraints that are unique to each individual embodiment. The fourth step is a step of modifying the programmable illuminator in the tool-1 based on the LP result to achieve matching of the lithographic data generated by tool-1 to tool-0. The fifth step is the step of generating re-measured lithographic data from the lithographic tool-1 after the modification of the illumination setting. The sixth step is the step of calculating a difference between the reference lithographic data and the re-measured lithographic data. If the difference is within the predetermined specification for tool matching tolerance the matching process is completed.

Each lithography tool among a set of lithography tools may optionally use different dedicated masks. Likewise, each lithography system (tool plus mask pair) employing a lithography tool among a set of lithography systems may optionally use different dedicated masks. A reference tool, to which all other lithography tools are intended to be matched, can be designated as tool-0. Alternatively, a reference tool may be a virtual tool that does not exist, but has ideal performance characteristics.

The printed wafer image data is represented by Ixy, in which x denotes the source configuration in tool-x and y denotes that exposure tool-y is the tool where the printed wafer data is measured from.

The following points differentiate the present invention from prior art methods. First, the present invention employs a "reference source" (s0 on tool-0) which creates measurable image data I00, e.g., printed wafer image data. Second, the present invention creates image I01 on tool1 where source s1 is configured according to the configuration of reference source s0. Third, the goal is to optimize the configuration of s1 so that I11 matches I00. Fourth, the objective function is a metric d of the difference between measured data for I11 and I00, and the optimization problem is to find s1 that minimizes that metric d.

To find the optimal configuration of adjustable (i.e., pixelated) source $\vec{s}$ (e.g., "s1" for tool-1 and "sn" for tool-n in general) which provides an exposure tool with an optimal matching (of results) to the reference system including a source $\vec{s}_0$ (or "s0") by minimizing a metric d of the difference between the images formed from s0 and s1, the following LP can be solved:

$$\text{Minimize } d,$$
$$\text{w.r.t. } \vec{s}$$

subject to:

(Eq. 4)

$$0 \leq s_j \leq S_{Max,j} \; (\forall j \mid 1 \leq j \leq J_{Max}) \qquad a_1)$$

$$\vec{s} \cdot \vec{p} \geq S_{Min} \qquad a_2)$$

$$s_j \leq s_{0,j} + \delta \; (\forall j \mid 1 \leq j \leq J_{Max}) \qquad a_3)$$

$$s_j \geq s_{0,j} - \delta \; (\forall j \mid 1 \leq j \leq J_{Max}) \qquad a_4)$$

$$d \geq \vec{s} \cdot \vec{I}_r - \vec{s}_0 \cdot \vec{I}_{r,0} - (X - X_0)\left(\vec{s}_0 \cdot \vec{I}_r\right) \; (\forall r \mid 1 \leq r \leq r_{Max}) \qquad b_1)$$

$$d \geq \vec{s}_0 \cdot \vec{I}_{r,0} - \vec{s} \cdot \vec{I}_r - (X_0 - X)\left(\vec{s}_0 \cdot \vec{I}_r\right) \; (\forall r \mid 1 \leq r \leq r_{Max}) \qquad b_2)$$

The constraints $a_1$), $b_1$), and $b_2$) represent inequalities in the same or in any mathematically equivalent form. The constraints $a_2$), $a_3$), and $a_4$) are preferred in the above form or in direct equivalents, but may be replaced with other inequalities provided that the set of constraints in (Eq. 4) include similar limitations as a whole.

The new constraints here are $a_3$, $a_4$, $b_1$, and $b_2$. The most critical of these are $b_1$ and $b_2$, which together say that d must be larger than the absolute value of the expression on the right side. The left hand ranges specify that a separate instance of the $b_1$ and $b_2$ constraints is created for each point in the image (indexed by r) at which one wants to match I11 to I00. The right sides of $b_1$ and $b_2$ are the negatives of one another; their common absolute value is the difference between 1) the intensity change that would need to be made in the I01 image in order to move the printed position of edge r when the I01 image is exposed using tool 1 to the printed position when the I00 image is exposed using the reference tool, and 2) the intensity gap between the I00 and I11 images. If this difference could be driven to 0, the I11 image would produce a printed feature that matches that produced by I00 at point r. Since variable d is minimized by the linear programming solver, it will be driven to equality with the worst-case (i.e., largest) difference arising between these quantities amongst all the match-points r. In addition, the optimizer will adjust the s variables (i.e., the tool 1 source variables) in order to make this worst-case match error as small as possible.

The $a_3$ and $a_4$ constraints are precautionary; they require that the tool-1 source not deviate too far from the reference source. Such an outcome is desirable since it helps ensure that patterns which are not included in the matching set will not be too badly degraded. Usually the $a_3$ and $a_4$ constraints will not be binding, i.e., their satisfaction will very likely be forced by the requirement that the new source match the printing signature of the reference source. However, the $a_3$ and $a_4$ constraints can be explicitly included in order to ensure this outcome, as might be desirable if, for example, the available printed data X was somewhat scanty. The constants present in the $a_3$ and $a_4$ constraints, in general, may be dependent on the pixel index j.

Constraint $a_1$ requires that the intensity assigned to each source pixel in the solution must fall within the range that the tool-1 illuminator can provide. Constraint $a_2$ requires that the source cover an adequately large portion of the illumination pupil, e.g., at least 10%. This helps prevent lens heating (and the image degradation associated with lens heating) by requiring that the exposing light not be concentrated in too small an area of the pupil. Close analogs to the $a_1$ and $a_2$ constraints are used in the prior art source optimization.

The optimization variables in eq. 4 are d and s. A standard source optimization provides values for s variables in the end, but they are obtained from eq. 2 after the LP in eq.1 is solved. In the prior art, the LP in eq.1 is formulated using script-s variables. In contrast, the LP in eq. 4 uses the s variables directly. Physically, the script-s variables are allowed to float arbitrarily large in the prior art LP without being bounded, except that if a script-s variable exceeds the bound $S_{max}$ which governs the associated s variable, the sum of the script-s variables is implicitly made to exceed the pupil fill requirement $S_{min}$ by a correspondingly increased proportion. This ensures that when eq. 2 is used to obtain the prior art s solution from the script-s LP solution, the result will satisfy both the $S_{min}$ and $S_{max}$ constraints. As far as source optimization is concerned, this procedure allows a superior metric to be optimized than a method of applying both constraints in an LP source optimization involving s directly.

There may in fact be useful embodiments of the current invention that employ the script-s variables. From a conceptual point of view, it is constraints $b_1$ and $b_2$ that most explicitly differ from the prior art.

Here, $r_{Max}$ refers to the total number of evaluation points, i.e., sample points. The evaluation points refer to points at which measurements are taken from the "r" image using a "golden" source, i.e., a reference source, and a "new" image from the source to be optimized. The evaluation points are chosen to thoroughly characterize all critical features in all calibration images.

$\vec{s}_0 \cdot \vec{I}_{r,0}$ denotes the intensity provided by a reference diffractive optical element source (or a "reference DOE source") at the r-th sample point. $\vec{s} \cdot \vec{I}_r$ denotes the corresponding quantity in tool-1. The image slope dI/dx in the direction perpendicular to the edge contour is given by $\vec{s}_0 \cdot \vec{I'}_r$ under conditions where tool-1 prints the calibration patterns using the reference source.

X is used only in the constraints. X denotes the measured edge position at the r-th sample point when the reference source is used in tool-0, while $X_0$ denotes the corresponding position in the corresponding measurement taken on exposures with the reference tool. Typically, X and $X_0$ are measured relative to the centerline of a symmetrical pattern. $\delta$ represents a tolerance on the allowed deviation of the matched tool-1 source from the reference source. The above formulation can also be applied in the case of multiple exposure processes. X can include measured lithographic data that come from variations of nominal process condition in which at least one of defocus and dose is changed. The variations of nominal process conditions are employed to enhance the optimality of the final source generated.

To match tools that use multiscan sources, the problem defined by eq. 4 is modified to include a binary variable b for each source pixel on tool-1, and constrain the solution to use no more than m scans. The LP in this case has the following form:

$$\text{Minimize } d, \text{ w.r.t. } \vec{s}$$

subject to:

(eq. 5)

$$0 \leq s_j \leq S_{Max,j} \ (\forall j \mid 1 \leq j \leq J_{Max}) \quad a_1)$$
$$\vec{s} \cdot \vec{p} \geq S_{Min} \quad a_2)$$
$$s_j \leq s_{0,j} + \delta \ (\forall j \mid 1 \leq j \leq J_{Max}) \quad a_3)$$
$$s_j \geq s_{0,j} - \delta \ (\forall j \mid 1 \leq j \leq J_{Max}) \quad a_4)$$
$$d \geq \vec{s} \cdot \vec{I}_r - \vec{s}_0 \cdot \vec{I}_{r,0} - (X - X_0)(\vec{s}_0 \cdot \vec{I}_r) \ (\forall r \mid 1 \leq r \leq r_{Max}) \quad b_1)$$
$$d \geq \vec{s}_0 \cdot \vec{I}_{r,0} - \vec{s} \cdot \vec{I}_r - (X_0 + X)(\vec{s}_0 \cdot \vec{I}_r) \ (\forall r \mid 1 \leq r \leq r_{Max}) \quad b_2)$$
$$s_j \leq S_{Max,j} b_j \ (\forall j \mid 1 \leq j \leq J_{Max}) \quad m_1)$$
$$\sum_{j=1}^{J_{Max}} b_j \leq m \quad m_2)$$

Comparison of eq. 5 with eq. 4 shows that the multi-scan constraints for this tool-matching method are different from those for a generic source optimization problem.

The constraints $a_1$), $b_1$), and $b_2$), $m_1$), and $m_2$) represent inequalities in the same or in any mathematically equivalent form. The constraints $a_2$), $a_3$), and $a_4$) are preferred in the above form or in direct equivalents, but may be replaced with other inequalities provided that the set of constraints in (Eq. 5) include similar limitations as a whole.

In essence, this new objective function d of the local source optimization is to match the optical proximity signature (such as measured CD as a function of pitch) from two tools. However, the objective function used for optimizing the source on a single tool, as in eq. 1, is to maximize the process common window of a common set of critical features.

The present invention provides a full flow for tool matching, which employs solutions to eq. 4 and eq. 5. This embodiment assumes there is a programmable illuminator on the tools to be matched.

Referring to FIG. 1, a first flow chart is shown according to a first embodiment of the present invention. Referring to step 110, optical proximity correction (OPC) is calibrated in tool-0, which is a reference tool. In other words, the OPC or any other equivalent optimization is based on preliminary lithographic data generated from tool-0. Referring to step 120, a mask is built for tool-0 for a single lithography process, or a set of masks for forming an image is built for tool-0 for multiexposure lithography process.

Referring to step 130, an illumination source 0 in tool-0 is configured to be consistent with the OPC applied to the mask or the set of masks. Referring to step 140, a photoresist layer is exposed in tool-0 employing the mask or the set of masks and with the setting applied at step 130. Referring to step 150, reference lithographic data is generated from tool-0 based on a patterned photoresist layer generated by exposure in tool-0 at step 140. The reference lithographic data can include measurements of critical dimensions (CD). The lithographic CD measurements can be performed on a set of predetermined test patterns.

Referring to step 132, an illumination source 1 in tool-1 is configured with the setting applied to the illumination source 0. Referring to step 142, a photoresist layer is exposed in tool-1 employing the mask or the set of masks and with the setting applied at step 132. Referring to step 152, lithographic data is generated from tool-1 based on a patterned photoresist layer generated by exposure in tool-1 at step 142. The measured lithographic data includes the same type of measurement data as the reference lithographic data.

Referring to step 160, the reference lithographic data from tool-0 and the measured lithographic data from tool-1 are compiled for comparison. Referring to step 170, the reference lithographic data from tool-0 and the measured lithographic data from tool-1 are compared to determine whether the difference between the reference lithographic data from tool-0 and the measured lithographic data from tool-1 is less than a predetermined specification for tool matching tolerance. For example, the CD measurement data from tool-0 and tool-1 can be compared. The predetermined specification for tool matching can be product-dependent or customer-dependent. If the difference between the reference lithographic data from tool-0 and the measured lithographic data from tool-1 is within the predetermined specification for tool matching tolerance, the process flow proceeds to step 199 and the tool matching is complete.

If the difference between the reference lithographic data from tool-0 and the measured lithographic data from tool-1 is greater than the predetermined specification for tool matching tolerance, the process flow proceeds to step 190, at which local source optimization is performed to minimize d using simulation data (Iro, Ir), which takes into account the optical lens parameters and critical dimension measurements as a function of X and $X_0$ of both tools. The optimization output s is then feed to tool-1 to make corresponding adjustment based on the s and the previous tool-1 source setting at step 132. After adjustment of the illumination in tool-1 at step 132, steps 142, 152, 160, 170, and 190 are repeatedly performed until the difference between the reference lithographic data from tool-0 and the measured lithographic data from tool-1 is within the predetermined specification for tool matching tolerance at step 170. In this embodiment only tool-1 is required to have a programmable illuminator.

Figure 2:
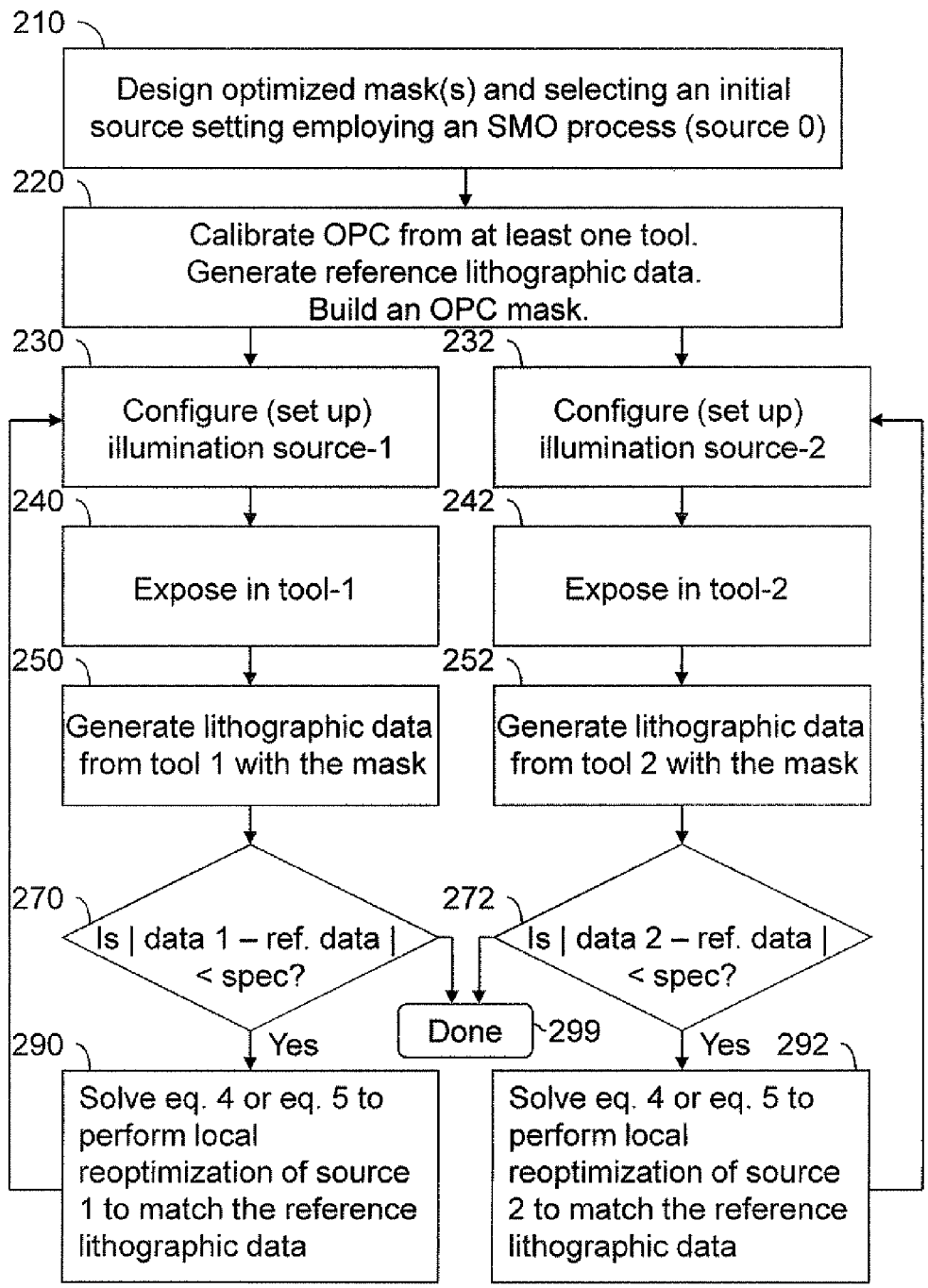
FIG. 2 is a second flow chart outlining a process for matching the lithographic characteristics of a first tool (tool-1) and a second tool (tool-2) with the corresponding lithographic characteristics of a fictitious ideal tool according to a second embodiment of the present invention.

Referring to FIG. 2, a second flow chart is shown according to a second embodiment of the present invention. This embodiment does not rely on the existence of a reference tool, but based on an ideal fictitious tool assumed in simulation. A pattern set is defined as in the first embodiment, and the image and the critical dimensions are calculated from this ideal tool. A mask is then built, which is referred to as an OPC mask or a "golden mask." Exposure data can be generated from any physical tools, which may be two or more tools. While the second flow chart illustrates matching of two physical tools, i.e., tool-1 and tool-2, to the reference tool (tool-0), i.e., an ideal tool, the method of the second embodiment can be extended to any number of physical tools by obtaining lithographic data of the test pattern from such tools and comparing the measured deviation from the ideal tool with a predetermined specification for tool matching tolerance. In this embodiment all physical tools, including tool-1 and tool-2, are required to have a programmable illuminator.

Referring to step 210, a source mask optimization (SMO) process is employed to design an optimized mask for single exposure lithography or a set of optimized masks for multi-exposure lithography. An accompanying initial source setting is determined.

Referring to step 220, optical proximity correction (OPC) data is calibrated in at least one tool, which can be tool-1 and/or tool-2. Reference lithographic data is generated from the fictitious ideal tool employing the OPC calibration data from the at least one tool. An optimized mask is built for single exposure lithography, or a set of optimized masks is built for multiexposure lithography. The mask or the set of masks is called an OPC mask or a set of OPC masks because the mask(s) incorporate(s) the optical proximity correction as determined by the calibration in the at least one tool.

Referring to step 230, an illumination source 1 in tool-1 is configured to be consistent with the OPC applied to the mask or the set of masks. Referring to step 240, a photoresist layer is exposed in tool-1 employing the mask or the set of masks and with the setting applied at step 230. Referring to step 250, a first lithographic data is generated from tool-1 based on a patterned photoresist layer generated by exposure in tool-1 at step 240. The first lithographic data can include measurements of critical dimensions (CD). The lithographic CD measurements can be performed on a set of predetermined test patterns as in the first embodiment.

Referring to step 270, the first lithographic data from tool-1 and the reference lithographic data from the ideal tool are compared to determine whether the difference between the reference lithographic data from the ideal tool and the first lithographic data from tool-1 is less than a predetermined specification for tool matching tolerance. For example, the CD measurement data from tool-1 can be compared with the estimated CD measurement data from the ideal tool. The predetermined specification for tool matching can be product-dependent or customer-dependent. If the difference between the first lithographic data from tool-1 and the reference lithographic data is within the predetermined specification for tool matching tolerance, the process flow proceeds to step 299 and the tool matching is complete.

If the difference between the first lithographic data from tool-1 and the estimated lithographic data from the ideal tool is greater than the predetermined specification for tool matching tolerance, the process flow proceeds to step 290, at which local source optimization is performed to minimize d using simulation data (Iro, Ir), which takes into account the optical lens parameters and critical dimension measurements as a function of X and $X_0$ of tool-1 and the ideal tool. The optimization output s is then feed to tool-1 to make corresponding adjustment based on the s and the previous tool-1 source configuration at step 230. After adjustment of the illumination in tool-1 at step 230, steps 240, 250, 270, and 290 are repeatedly performed until the difference between the first lithographic data from tool-1 and the estimated lithographic data from the ideal tool is within the predetermined specification for tool matching tolerance at step 270.

Referring to step 232, an illumination source 2 in tool-2 is configured to be consistent with the OPC applied to the mask or the set of masks. Referring to step 242, a photoresist layer is exposed in tool-2 employing the mask or the set of masks and with the setting applied at step 232. Referring to step 252, a second lithographic data is generated from tool-2 based on a patterned photoresist layer generated by exposure in tool-2 at step 242. The second lithographic data includes the same type of measurement data as the first lithographic data.

Referring to step 272, the second lithographic data from tool-2 and the reference lithographic data from the ideal tool (tool-0) are compared to determine whether the difference between the reference lithographic data from the ideal tool and the second lithographic data from tool-2 is less than a predetermined specification for tool matching tolerance. For example, the CD measurement data from tool-2 can be compared with the estimated CD measurement data from the ideal tool. The predetermined specification for tool matching can be product-dependent or customer-dependent. If the difference between the second lithographic data from tool-2 and the reference lithographic data is within the predetermined specification for tool matching tolerance, the process flow proceeds to step 299 and the tool matching is complete.

If the difference between the second lithographic data from tool-2 and the estimated lithographic data from the ideal tool is greater than the predetermined specification for tool matching tolerance, the process flow proceeds to step 292, at which local source optimization is performed to minimize d using simulation data (Iro, Ir), which takes into account the optical lens parameters and critical dimension measurements as a function of X and $X_0$ of tool-2 and the ideal tool. The optimization output s is then feed to tool-2 to make corresponding adjustments based on the s and the previous tool-2 source configuration at step 232. After adjustment of the illumination in tool-2 at step 232, steps 242, 252, 272, and 292 are repeatedly performed until the difference between the second lithographic data from tool-2 and the estimated lithographic data from the ideal tool is within the predetermined specification for tool matching tolerance at step 272.

According to a third embodiment of the present invention, the solutions to eq. 4 or eq. 5 can be used to perform local optimization of a tool that may see multiple copies of the same mask for some reason, such as mask redundancy or mask rebuild due to mask damage. In this case whenever the tool sees a second version of the same mask, the lithographic data from a later exposure is compared to the corresponding lithographic data form an earlier version of the same mask from the same tool. If the lithographic data from the later exposure is out of spec, the illumination of the tool can be readjusted for this mask. The tool can have a recipe dependent illumination configuration, which can be saved as a setting unique to a certain mask. The flow can be repeated until the lithographic data from the later version of the mask is matched on the same tool. The lithographic tool needs to have a programmable illuminator.

According to a fourth embodiment of the present invention, similar methods are applied to the case of multiple tools and multiple copies of same mask in a manufacturing environment. The lithographic tool needs to have a programmable illuminator.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of matching at least one lithographic tool using a programmable illuminator, said method comprising:
    providing reference lithographic data from a reference physical illumination tool or an ideal illumination tool;
    generating measured lithographic data from a lithographic tool having a programmable illuminator;
    calculating a difference between said reference lithographic data and said measured lithographic data;
    minimizing, employing a machine that runs a linear programming solver, a metric of difference d with respect to $\vec{s}$ by solving a linear programming problem (LP) under a set of constraints, said set of constraints including constraints $a_1$), $b_1$), and $b_2$) that are given by:

$$0 \le s_j \le S_{Max,j} \quad (\forall j | 1 \le j \le J_{Max}) \qquad a_1)$$

$$d \ge \vec{s} \cdot \vec{I}_r - \vec{s}_0 \cdot \vec{I}_{r,0} - (X - X_0)\left(\vec{s}_0 \cdot \dot{\vec{I}}_r\right) \quad (\forall r | 1 \le r \le r_{Max}) \qquad b_1)$$

$$d \ge \vec{s}_0 \cdot \vec{I}_{r,0} - \vec{s} \cdot \vec{I}_r - (X_0 - X)\left(\vec{s}_0 \cdot \dot{\vec{I}}_r\right) \quad (\forall r | 1 \le r \le r_{Max}), \qquad b_2)$$

wherein $\vec{s}$ is a list of unknown source pixel intensities, $s_j$ is a j-th component of $\vec{s}$, j is an index running from 1 to $J_{Max}$, $J_{Max}$ is a total number of source pixels, $S_{Max,j}$ is a j-th component of a maximum source pixel intensity, $\vec{s}_0 \cdot \vec{I}_{r,0}$ denotes an intensity provided by a reference source that generates said reference lithographic data at an r-th sample point, $\vec{s} \cdot \vec{I}_r$ denotes a corresponding intensity provided by a source of said lithographic tool at said r-th sample point, r is an index running from 1 to $r_{Max}$, $r_{Max}$ is a total number of sample points, $\vec{s}_0 \cdot \dot{\vec{I}}_r$ is an image slope dI/dx in the direction perpendicular to the edge contour under conditions where said tool prints a reference pattern, X is a measured edge position at an r-th sample point when a reference source is used in said lithographic tool, and $X_0$ is a corresponding position in a corresponding measurement taken on exposures with said reference physical illumination tool or an equivalent calculated from said ideal illumination tool.

2. The method of claim 1, wherein said set of constraints further includes constraints $a_3$) and $a_4$) that are given by:

$$s_j \le s_{0,j} + \delta \quad (\forall j | 1 \le j \le J_{Max}) \qquad a_3)$$

$$s_j \ge s_{0,j} - \delta \quad (\forall j | 1 \le j \le J_{Max}), \qquad a_4)$$

wherein $s_{0,j}$ is a j-th component of a reference source intensity list, and $\delta$ is a tolerance on allowed deviation of said measured lithographic data from said reference lithographic data.

3. The method of claim 2, wherein said set of constraints further includes a constraint $a_2$) that is given by:

$$\vec{s} \cdot \vec{p} \ge S_{Min}, \qquad a_2)$$

wherein $\vec{p}$ is a list of source pixel areas, and $S_{Min}$ is a minimum allowed pupil fill.

4. The method of claim 1, wherein said measured lithographic data is generated in said lithographic tool by a single exposure, and said measured lithographic data is obtained at a plurality of exposure conditions in which at least one of defocus and dose is changed.

5. The method of claim 1, further comprising modifying an illumination setting of said programmable illuminator based on a solution from said LP problem.

6. The method of claim 5, further comprising:
generating re-measured lithographic data from said lithographic tool after said modifying of said illumination setting; and
calculating a difference between said reference lithographic data and said re-measured lithographic data.

7. The method of claim 6, further comprising determining whether a difference between said reference lithographic data and said re-measured lithographic data is within the predetermined specification for tool matching tolerance.

8. The method of claim 7, further comprising iteratively repeating additional steps until a difference between said reference lithographic data and additional re-measured lithographic data is within the predetermined specification for tool matching tolerance, wherein said additional steps include:
re-minimizing said metric of difference d with respect to $\vec{s}$ by solving said linear programming (LP) problem again;
generating additional re-measured lithographic data from said lithographic tool after additional modifying of said illumination setting; and
calculating a difference between said reference lithographic data and said additional re-measured lithographic data.

9. The method of claim 1, wherein said reference lithographic data is generated from said reference physical illumination tool, and said method further comprises:
calibrating optical proximity correction (OPC) from said reference physical illumination tool at an illumination setting; and
building a mask based on said calibrating of OPC, wherein said mask includes features that optimize an exposed image when used in combination with said illumination setting.

10. The method of claim 1, wherein said reference lithographic data and said measured lithographic data are generated employing said mask.

11. The method of claim 1, wherein said reference lithographic data is generated from said ideal illumination tool, and said method further comprises employing a source mask optimization process to design an optimized mask and an accompanying illumination setting for an ideal illumination source.

12. The method of claim 11, further comprising:
calibrating optical proximity correction (OPC) from at least one physical tool;
generating said reference lithographic data based on data from said calibrating of OPC; and
building a physical mask based on a design for said optimized mask and said reference lithographic data, wherein said measured lithographic data is generated employing said physical mask.

13. A method of matching at least one lithographic tool using a programmable illuminator, said method comprising:
providing reference lithographic data from a reference physical illumination tool or an ideal illumination tool;
generating measured lithographic data from a lithographic tool having a programmable illuminator;
calculating a difference between said reference lithographic data and said measured lithographic data;
minimizing, employing a machine that runs a linear programming solver, a metric of difference d with respect to $\vec{s}$ by solving a linear programming (LP) problem under a set of constraints, said set of constraints including constraints $a_1$), $b_1$), $b_2$), $m_1$), and $m_2$) that are given by:

$$0 \le s_j \le S_{Max,j} \quad (\forall j | 1 \le j \le J_{Max}) \qquad a_1)$$

$$d \ge \vec{s} \cdot \vec{I}_r - \vec{s}_0 \cdot \vec{I}_{r,0} - (X - X_0)\left(\vec{s}_0 \cdot \dot{\vec{I}}_r\right) \quad (\forall r | 1 \le r \le r_{Max}) \qquad b_1)$$

$$d \ge \vec{s}_0 \cdot \vec{I}_{r,0} - \vec{s} \cdot \vec{I}_r - (X_0 + X)\left(\vec{s}_0 \cdot \dot{\vec{I}}_r\right) \quad (\forall r | 1 \le r \le r_{Max}) \qquad b_2)$$

-continued $$s_j \leq S_{Max,j} b_j \quad (\forall j | 1 \leq j \leq J_{Max}) \qquad \text{m}_1)$$

$$\sum_{j=1}^{J_{Max}} b_j \leq m \qquad \text{m}_2)$$

wherein $\vec{s}$ is a list of unknown source pixel intensities, $s_j$ is a j-th component of $\vec{s}$, j is an index running from 1 to $J_{Max}$, $J_{Max}$ is a total number of source pixels, $S_{Max,j}$ is a j-th component of a maximum source pixel intensity, $\vec{s}_0 \cdot \vec{T}_{r,0}$ denotes an intensity provided by a reference source that generates said reference lithographic data at an r-th sample point, $\vec{s} \cdot \vec{T}_r$ denotes a corresponding intensity provided by a source of said lithographic tool at said r-th sample point, r is an index running from 1 to $r_{Max}$, $r_{Max}$ is a total number of sample points, $\vec{s}_0 \cdot \vec{T}'_r$ is an image slope dI/dx in the direction perpendicular to the edge contour under conditions where said tool prints a reference pattern, X is a measured edge position at an r-th sample point when a reference source is used in said lithographic tool, $X_0$ is a corresponding position in a corresponding measurement taken on exposures with said reference physical illumination tool or an equivalent calculated from said ideal illumination tool, $b_j$ is a j-th component of a binary variable, and m is a maximum number of exposure scans.

14. The method of claim 13, wherein said set of constraints further includes constraints $a_3$) and $a_4$) that are given by:

$$s_j \leq s_{0,j} + \delta \quad (\forall j | 1 \leq j \leq J_{Max}) \qquad a_3)$$

$$s_j \geq s_{0,j} - \delta \quad (\forall j | 1 \leq j \leq J_{Max}), \qquad a_4)$$

wherein $s_{0,j}$ is a j-th component of a reference source intensity list, and $\delta$ is a tolerance on allowed deviation of said measured lithographic data from said reference lithographic data.

15. The method of claim 14, wherein said set of constraints further includes a constraint $a_2$) that is given by:

$$\vec{s} \cdot \vec{p} \geq S_{Min}, \qquad a_2)$$

wherein $\vec{p}$ is a list of source pixel areas, and $S_{Min}$ is a minimum allowed pupil fill.

16. The method of claim 13, wherein said measured lithographic data is generated in said lithographic tool by multiple exposures, and said measured lithographic data is obtained at a plurality of exposure conditions in which at least one of defocus and dose is changed.

17. The method of claim 13, further comprising modifying an illumination setting of said programmable illuminator based on a solution from said LP problem.

18. The method of claim 17, further comprising:
generating re-measured lithographic data from said lithographic tool after said modifying of said illumination setting; and
calculating a difference between said reference lithographic data and said re-measured lithographic data.

19. The method of claim 18, further comprising determining whether a difference between said reference lithographic data and said re-measured lithographic data is within the predetermined specification for tool matching tolerance.

20. The method of claim 19, further comprising iteratively repeating additional steps until a difference between said reference lithographic data and additional re-measured lithographic data is within the predetermined specification for tool matching tolerance, wherein said additional steps include:
re-minimizing said metric of difference d with respect to $\vec{s}$ by solving said linear programming (LP) problem again;
generating additional re-measured lithographic data from said lithographic tool after additional modifying of said illumination setting; and
calculating a difference between said reference lithographic data and said additional re-measured lithographic data.

21. The method of claim 13, wherein said reference lithographic data is generated from said reference physical illumination tool, and said method further comprises:
calibrating optical proximity correction (OPC) from said reference physical illumination tool at an illumination setting; and
building a set of masks based on said calibrating of OPC, wherein said set of masks includes features that optimize an exposed image when used in combination with said illumination setting.

22. The method of claim 13, wherein said reference lithographic data and said measured lithographic data are generated employing said set of masks.

23. The method of claim 13, wherein said reference lithographic data is generated from said ideal illumination tool, and said method further comprises employing a source mask optimization process to design a set of optimized masks and accompanying illumination settings for an ideal illumination source.

24. The method of claim 23, further comprising:
calibrating optical proximity correction (OPC) from at least one physical tool;
generating said reference lithographic data based on data from said calibrating of OPC; and
building a set of physical masks based on a design for said optimized mask and said reference lithographic data, wherein said measured lithographic data is generated employing said set of physical masks.

* * * * *